United States Patent
Uzunkol et al.

(10) Patent No.: US 9,425,746 B2
(45) Date of Patent: Aug. 23, 2016

(54) SPURIOUS SIGNAL MITIGATION FOR CARRIER AGGREGATION AMPLIFIER

(71) Applicant: QUALCOMM Incorporated, San Diego, CA (US)

(72) Inventors: Mehmet Uzunkol, San Diego, CA (US); Rui Xu, San Diego, CA (US); Ahmed Abdel Monem Youssef, San Diego, CA (US); Wingching Vincent Leung, San Diego, CA (US); Ehab Ahmed Sobhy Abdel Ghany, San Diego, CA (US); Allen He, San Diego, CA (US); Sang Hyun Woo, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 25 days.

(21) Appl. No.: 14/228,288

(22) Filed: Mar. 28, 2014

(65) Prior Publication Data
US 2015/0280651 A1 Oct. 1, 2015

(51) Int. Cl.
| | |
|---|---|
| *H03F 3/72* | (2006.01) |
| *H03F 1/02* | (2006.01) |
| *H03F 3/19* | (2006.01) |
| *H03F 3/00* | (2006.01) |
| *H03F 1/08* | (2006.01) |
| *H03F 1/30* | (2006.01) |
| *H03F 3/195* | (2006.01) |
| *H03F 3/68* | (2006.01) |

(52) U.S. Cl.
CPC .............. *H03F 1/0211* (2013.01); *H03F 1/086* (2013.01); *H03F 1/30* (2013.01); *H03F 3/005* (2013.01); *H03F 3/19* (2013.01); *H03F 3/195* (2013.01); *H03F 3/68* (2013.01); *H03F 3/72* (2013.01); *H03F 1/0277* (2013.01); *H03F 2200/294* (2013.01); *H03F 2200/451* (2013.01)

(58) Field of Classification Search
CPC ....... H03F 3/72; H03F 1/0277; H03F 3/1935; H03F 3/193; H03F 2200/372; H03F 1/223; H03F 1/22; H03F 2200/294; H03F 3/211; H03F 3/602; H03F 3/604; H03F 1/0288; H03F 1/0211; H03F 3/19; H03F 2200/451; H03F 3/005; H03F 1/086; H03F 1/30; H03F 3/195; H03F 3/68; H03F 1/02; H03F 3/00; H03G 1/0088
USPC ........................................ 330/51, 124 R, 295
See application file for complete search history.

(56) References Cited

U.S. PATENT DOCUMENTS

| | | |
|---|---|---|
| 7,400,865 B2 | 7/2008 | Jarvinen |
| 7,555,258 B2 | 6/2009 | Sakurai et al. |
| 7,675,359 B2 | 3/2010 | Vice |

(Continued)

OTHER PUBLICATIONS

International Search Report and Written Opinion—PCT/US2015/022932—ISA/EPO—Jul. 6, 2015.

*Primary Examiner* — Khanh V Nguyen
(74) *Attorney, Agent, or Firm* — Smith Tempel Blaha LLC

(57) ABSTRACT

A device includes an amplifier circuit comprising a plurality of amplification paths, and at least one switchable bypass capacitance coupled to an associated shared power distribution network, the at least one switchable bypass capacitance and at least one of the plurality of amplification paths responsive to a control signal configured to selectively ground the at least one switchable bypass capacitance and selectively enable the at least one of the amplification paths based on a selected operating mode.

20 Claims, 10 Drawing Sheets

(56) References Cited

U.S. PATENT DOCUMENTS

| | | | |
|---|---|---|---|
| 8,598,950 B2 * | 12/2013 | Khesbak | 330/51 |
| 8,884,696 B2 * | 11/2014 | Langer | 330/127 |
| 2012/0146731 A1 | 6/2012 | Khesbak | |
| 2013/0190036 A1 | 7/2013 | Zhao et al. | |
| 2013/0214862 A1 | 8/2013 | Presti et al. | |
| 2013/0250819 A1 | 9/2013 | Khlat et al. | |
| 2015/0137892 A1 * | 5/2015 | Imazeki et al. | 330/297 |

* cited by examiner

SPURIOUS SIGNAL MITIGATION FOR CARRIER AGGREGATION AMPLIFIER

BACKGROUND

1. Field

The present disclosure relates generally to electronics, and more specifically to transmitters and receivers.

2. Background

In a radio frequency (RF) transceiver, a communication signal is developed, upconverted, amplified and transmitted by a transmitter and is received, amplified, downconverted and recovered by a receiver. In the receiver, the communication signal is typically received and downconverted by receive circuitry including a filter, an amplifier, a mixer, and other components, to recover the information contained in the communication signal. A single transmitter or receiver can be configured to operate using multiple transmit frequencies and/or multiple receive frequencies. For a receiver to be able to simultaneously receive two or more receive signals, the concurrent operation of two or more receive paths is used. Such systems are sometimes referred to as "carrier-aggregation" (CA) systems. The term "carrier-aggregation" may refer to systems that include inter-band carrier aggregation (Inter-CA) and intra-band carrier aggregation (Intra-CA). Intra-CA refers to the processing of two or more separate (either contiguous or non-contiguous) carrier signals that occur in the same communication band. The carrier aggregated RF signal is typically down-converted using two or more distinct local oscillator (LO) frequencies, which generally employs a low noise amplifier (LNA) having a single RF input and multiple RF outputs to process the multiple carriers present in the Intra-CA RF signal.

State-of-the-art transceiver design focuses on reducing the total number of pins to be cost competitive. Such trends will reduce the number of power supply and ground pins, and will likely drive the circuit architecture toward using shared low dropout (LDO) voltage regulators for reducing the number of power pins needed to power the various amplifiers in the transceiver. State-of-the-art transceiver design focuses on integrating more concurrently operating systems which will aggregate coupling between and among these systems and demand innovative circuit and signal isolation strategies.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used herein, the terms "jammer," "jammer signal," "interfering signal," "TX jammer," and "TX jammer signal" refer to any signal received by receive circuitry that desensitizes the receiver, or that interferes with or hinders the reception and recovery of an information signal received in a receiver.

As used herein, the terms "desired signal," "received information signal" "receive signal," and "receiver signal," refer to a communication signal received in a receiver and containing information sought to be recovered by a receiver.

As used herein, the term "spurious signal" and the term "spur" refer to unwanted signal energy that overcomes a filter and is present in and interferes with the reception of a desired signal in a communication channel.

Exemplary embodiments of the disclosure are directed toward a spurious (spur) signal mitigation architecture that can be implemented in a shared power distribution system to provide power to one or more of an amplifier, a power amplifier, a low noise amplifier (LNA), or another amplification device, while reducing the impact of spurious signals on the transceiver.

Figure 1:
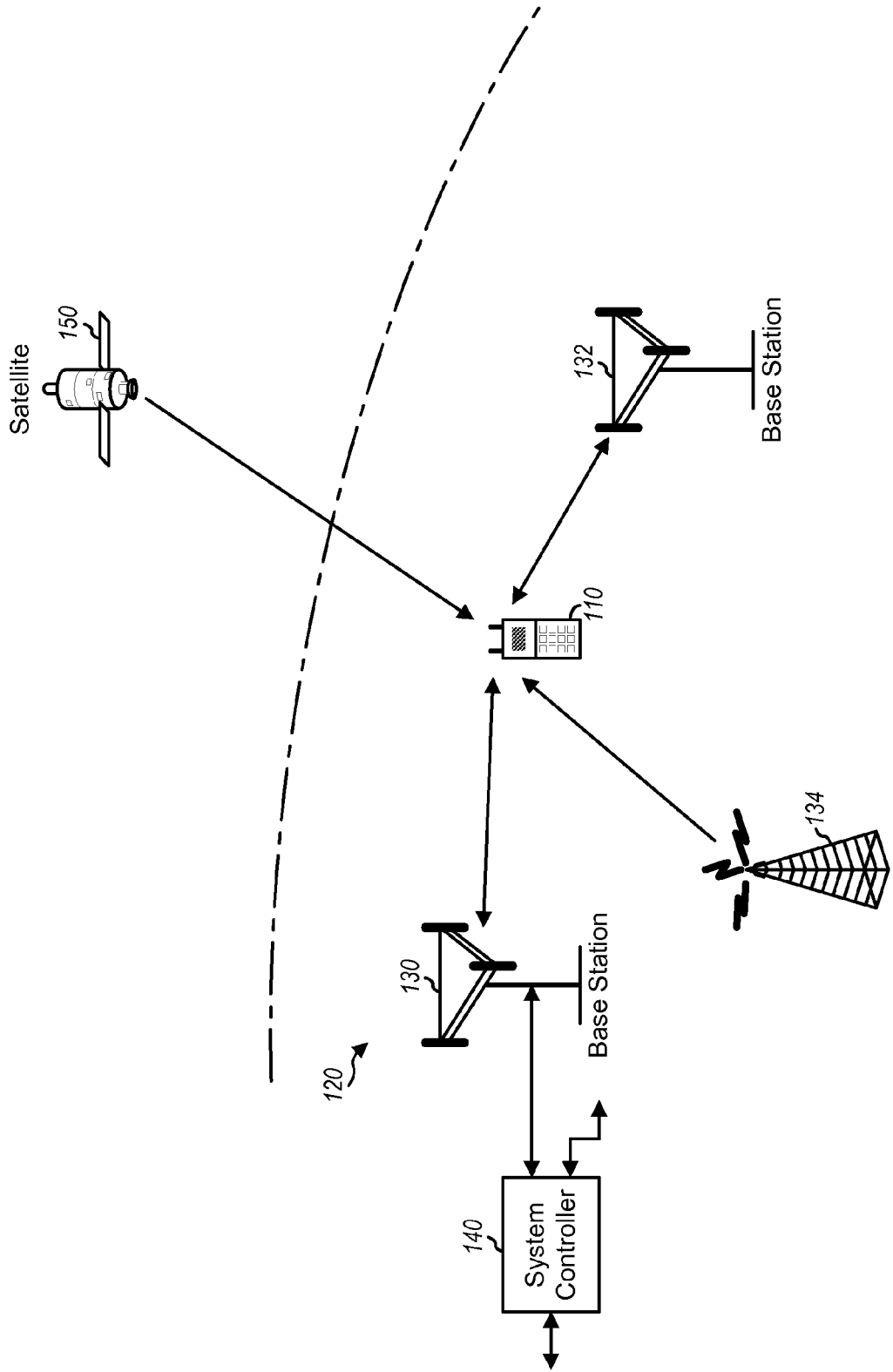
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
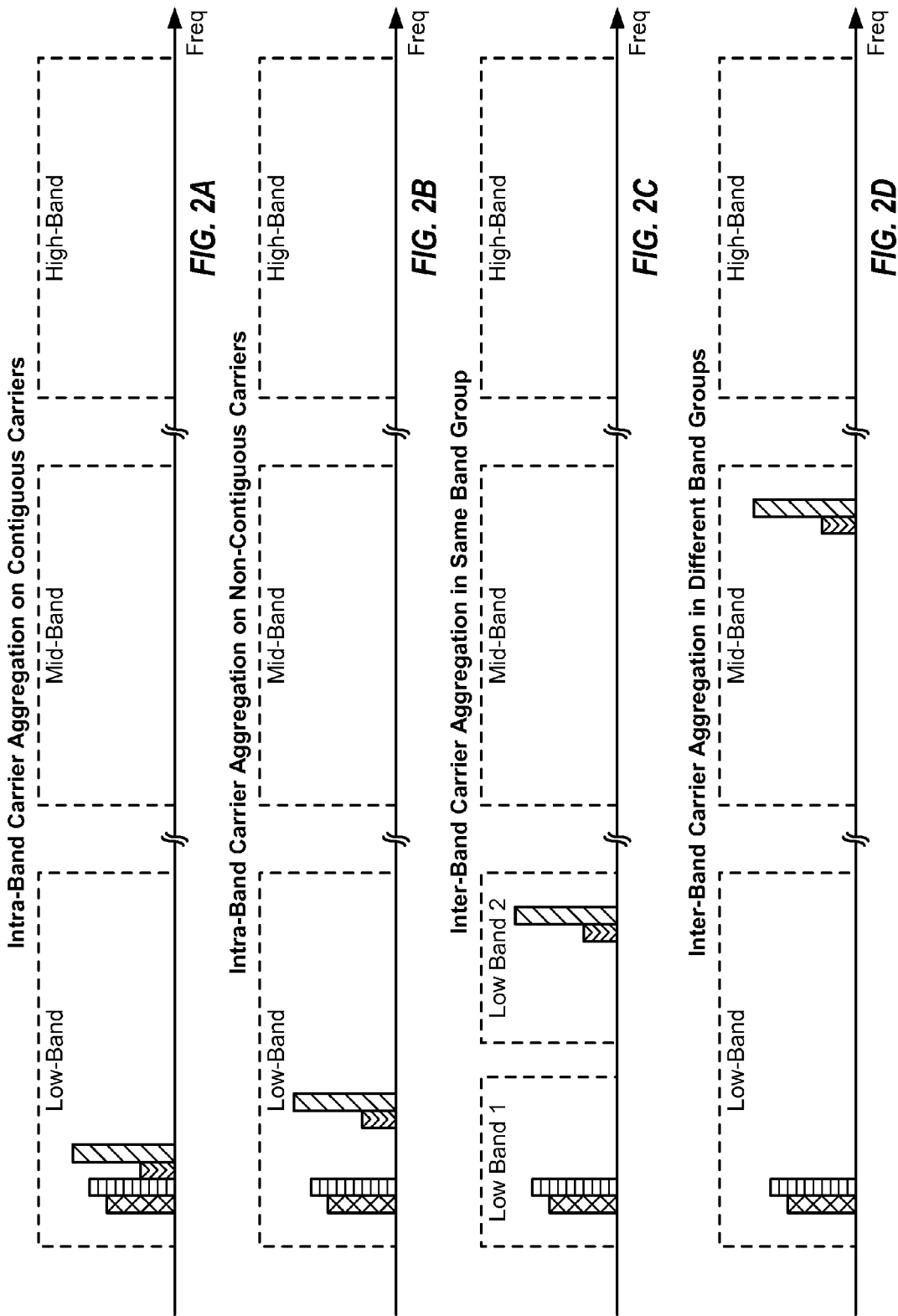
FIG. 2A is a graphical diagram showing an example of contiguous intra-band carrier-aggregation (CA).
FIG. 2B is a graphical diagram showing an example of non-contiguous intra-band CA.
FIG. 2C is a graphical diagram showing an example of inter-band CA in the same band group.
FIG. 2D is a graphical diagram showing an example of inter-band CA in different band groups.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
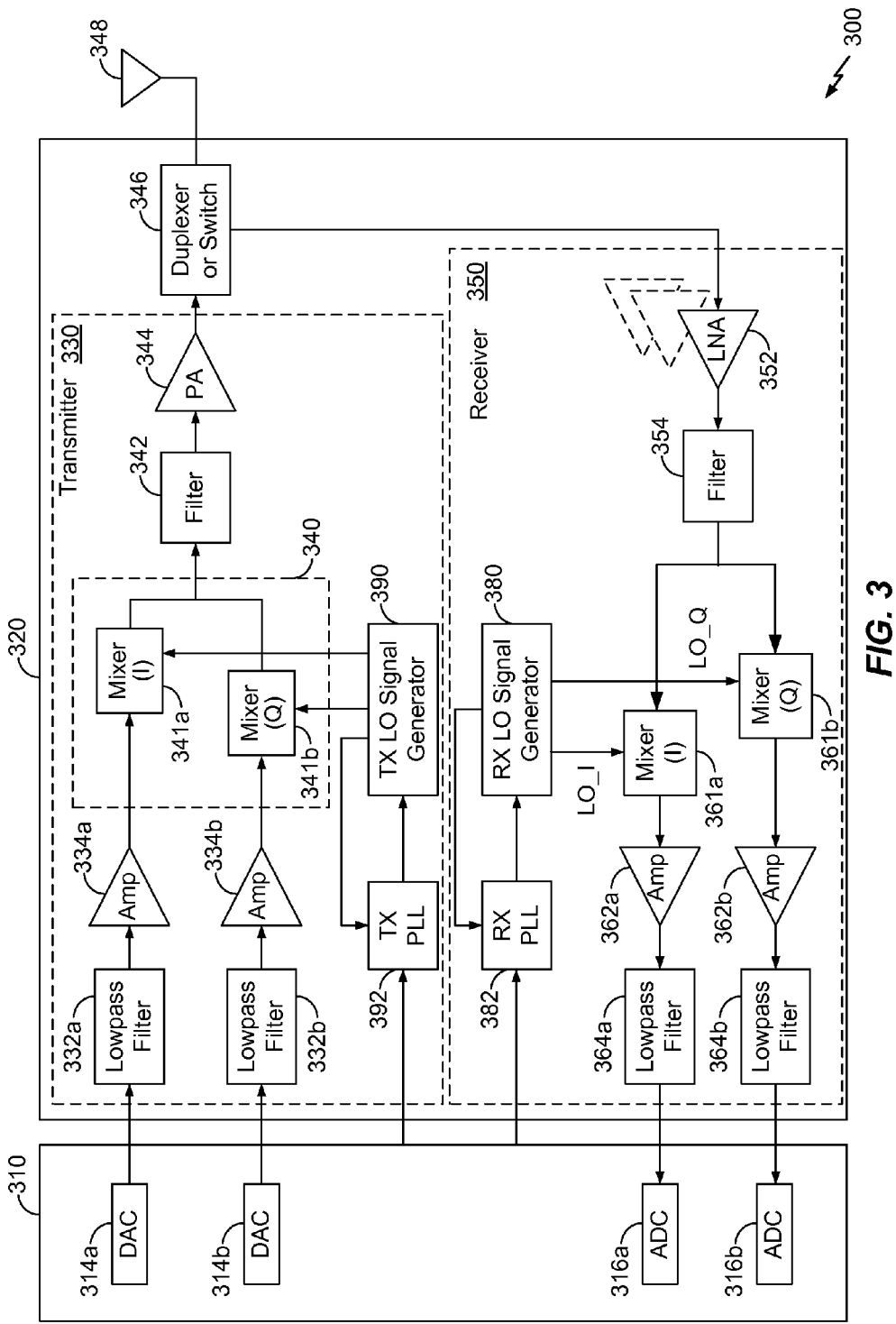
FIG. 3 is a block diagram of an exemplary design of the wireless device in FIG. 1.

FIG. 3 is a block diagram showing a wireless communication device 300 in which the exemplary techniques of the present disclosure may be implemented. FIG. 3 shows an example of a transceiver 300. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter and receiver. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Figure 4:
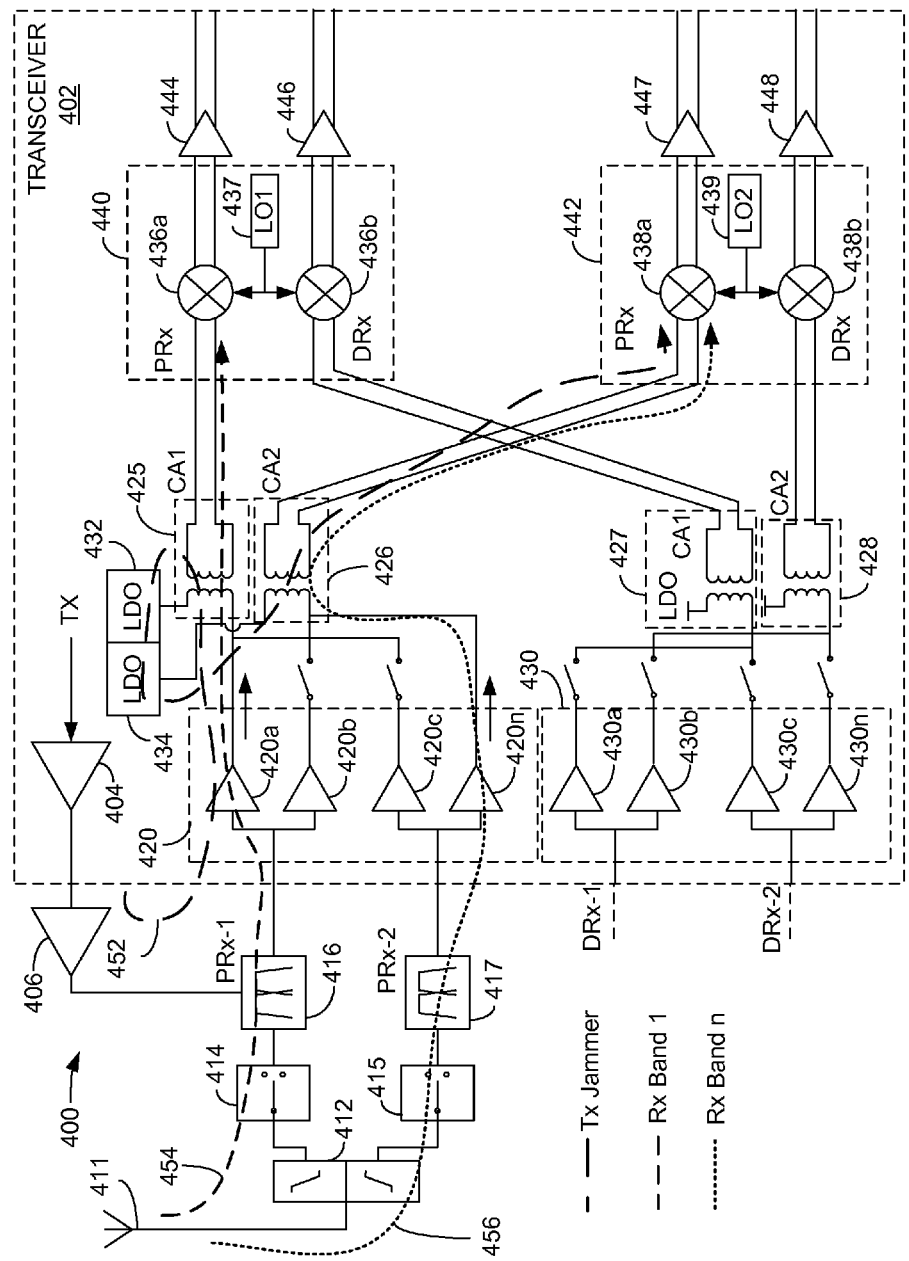
FIG. 4 is a schematic diagram illustrating an exemplary embodiment of a transceiver front-end configured to process multiple communication signals.

FIG. 4 is a schematic diagram illustrating an exemplary embodiment of a transceiver front-end configured to process multiple communication signals. The transceiver front end 402 comprises a transmit driver 404 configured to receive an information signal for transmission. The transmit driver provides the transmit signal to a power amplifier 406 for transmission through a first filter 416, a first switch 414, a diplexer 412 to an antenna 411.

A receive signal is received at the antenna 411, provided through the diplexer 412 to the first switch 414 and the second switch 4154, depending on the frequency of the received signal. The first switch 414 and the second switch 415 can be controlled by a control signal provided by, for example, the data processor 310 (FIG. 3), or another control element. In the exemplary embodiment shown in FIG. 4, the first filter 416 provides transmit signal rejection and receive band filtering, and the second filter 417 provides receive band filtering. In a carrier aggregation communication methodology, the first filter 416 may be configured to process a communication signal having a first carrier at a first frequency and the second filter 417 may be configured to process a second carrier at a second frequency.

The transceiver front end 402 also comprises a first low noise amplifier (LNA) circuit 420 and a second LNA circuit 430. The first LNA circuit 420 comprises exemplary LNAs 420a, 420b, 420c and 420n, where the "n" designation refers to an integer number of LNAs, depending on the number of frequency bands. The second LNA circuit 430 comprises exemplary LNAs 430a, 430b, 430c and 430n, where the "n" designation refers to an integer number of LNAs, depending on the number of frequency bands. In the exemplary embodiment shown in FIG. 4, the first LNA circuit 420 can be configured to receive primary receive channels and the second LNA circuit 430 can be configured to receive secondary or diversity, receive channels. Although omitted for ease of illustration, the second LNA circuit 430 is also coupled to an antenna, diplexer, switches and filters, which may be the same or different from the antenna 411, diplexer 412, first switch 414, second switch 415, first filter 416 and second filter 417. In the exemplary embodiment shown in FIG. 4, the first LNA circuit 420 and the second LNA circuit 430 are configured to operate on a single-ended communication signal. In alternative exemplary embodiment, the first LNA circuit 420 and the second LNA circuit 430 can be configured to operate on a differential communication signal.

The first LNA circuit 420 is coupled to a transformer 425 and a transformer 426. In this exemplary embodiment, the transformer 425 can be configured to process a first carrier at a first frequency and provide an output CA1 and the transformer 426 can be configured to process a second carrier at a second frequency and provide an output CA2.

The second LNA circuit 430 is coupled to a transformer 427 and a transformer 428. In this exemplary embodiment, the transformer 427 can be configured to process the first carrier at the first frequency and provide the output CA1 and the transformer 428 can be configured to process the second carrier at the second frequency and provide an output CA2. In an exemplary embodiment, the transformers 425, 426, 427 and 428 provide single-ended to differential signal conversion such that the outputs CA1 and CA2 from the transformers 425, 426, 427 and 428 are differential signals.

In an exemplary embodiment, the transformers are coupled to a shared power distribution network comprising a low dropout voltage regulator (LDO) architecture. In this exemplary embodiment, the transformers 425 and 427, configured to provide the CA1 output signal, are coupled to LDO 432; and the transformers 426 and 428, configured to provide the CA2 output signal, are coupled to LDO 434.

The transceiver front end 402 also comprises a first downconverter circuit 440 and a second downconverter circuit 442. The first downconverter circuit 440 comprises mixers 436a and 436b, which receive a first local oscillator signal (LO1) from local oscillator signal generator 437. The second downconverter circuit 442 comprises mixers 438a and 438b, which receive a second local oscillator signal (LO2) from local oscillator signal generator 439. In an exemplary embodiment, the mixers 436a and 436b process the receive signal CA1 from transformer 425 and transformer 427, and the mixers 438a and 438b process the receive signal CA2 from transformer 426 and transformer 428.

The output of the mixer 436a is provided to an amplifier 444, the output of the mixer 436b is provided to an amplifier 446, the output of the mixer 438a is provided to an amplifier 447 and the output of the mixer 438b is provided to an amplifier 448. The respective outputs of the amplifiers 444, 446, 447 and 448 are then further processed by other components within a wireless device.

One of the challenges when implementing a shared power distribution network, such as that provided by the LDO 432 and the LDO 434, is that spurious signal coupling may degrade receiver performance. For example, the arrow 452 represents transmit signal energy that may overcome the filter 416 and enter the LNA 420a, proceed through the transformer 425, through the LDO circuits 432 and 434, and then enter the mixer 438a, thus making downconversion and recovery of the signal 454 on CA1 and/or the downconversion and recovery of the signal 456 on CA2 difficult.

Figure 5:
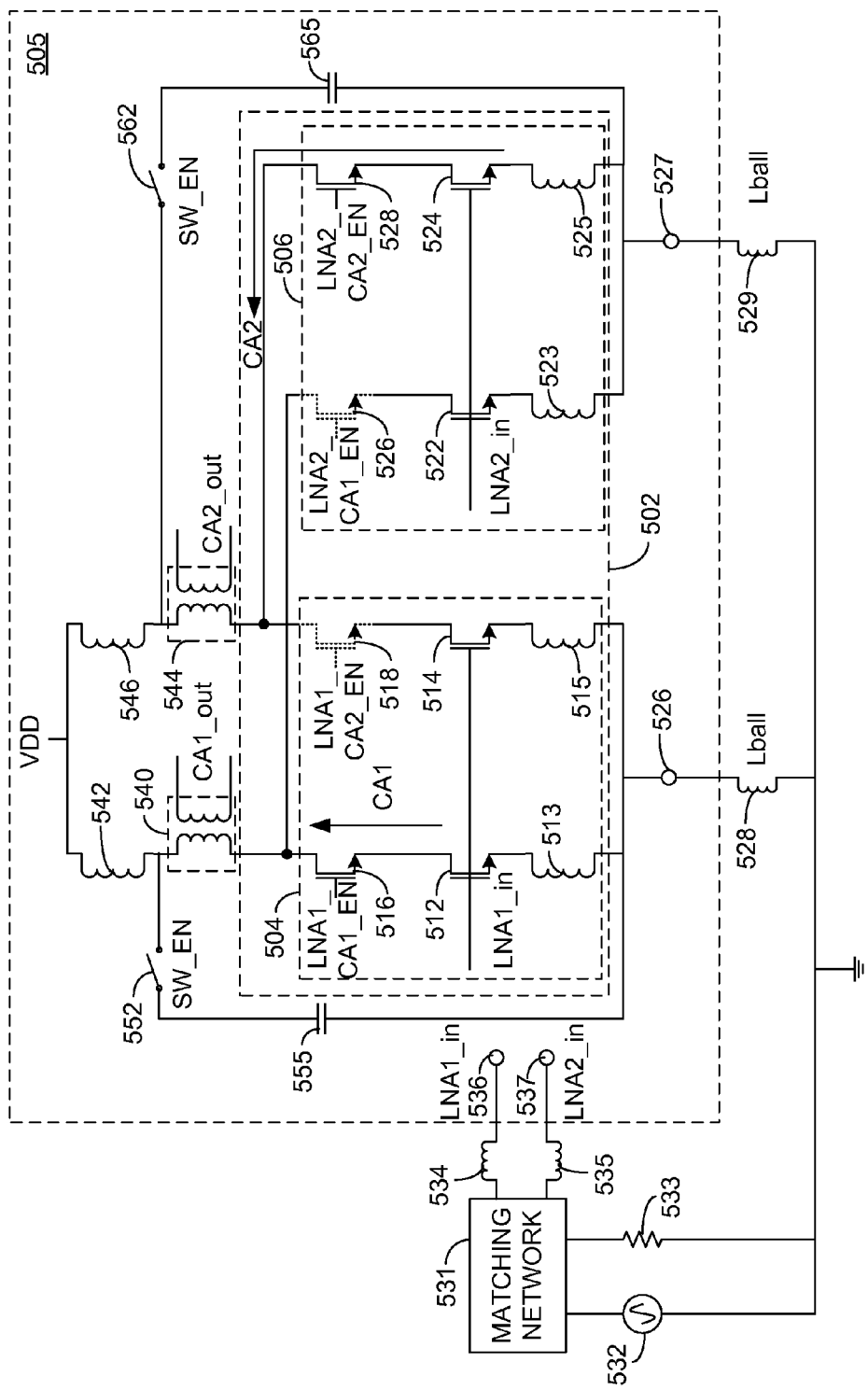
FIG. 5 is a schematic diagram illustrating an exemplary embodiment of an LNA having a spurious signal mitigation architecture.

FIG. 5 is a schematic diagram 500 illustrating an exemplary embodiment of an LNA having a spurious signal mitigation architecture. An LNA circuit 502 can be implemented on a die 505. In an exemplary embodiment, the LNA circuit 502 comprises a first LNA 504 and a second LNA 506. The first LNA 504 comprises a gain transistor 512 having a gate configured to receive a first input signal LNA1_in, a source coupled to a degeneration inductor 513 and a drain coupled to a source of a cascode transistor 516. The other side of the degeneration inductor 513 is coupled to a terminal 526. The terminal 526 may be a circuit connection referred to as a ball, solder ball, micro ball, or other circuit interface for the die 505. An inductance 528 refers to an inductance of a routing connection that couples the terminal 526 to ground. The first LNA 504 also comprises a gain transistor 514 having a gate configured to receive the input signal, LNA1_in, a source coupled to a degeneration inductor 515 and a drain coupled to a source of a cascode transistor 518. The other side of the degeneration inductor 515 is coupled to the terminal 526. The cascode transistor 516 is configured to receive a LNA1_CA_1_EN enable signal at its gate. The cascode transistor 518 is configured to receive a LNA1_CA_2_EN enable signal at its gate. In an alternative exemplary embodiment, a single source degeneration inductor may be implemented for both gain transistors 512 and 514.

The second LNA 506 comprises a gain transistor 522 having a gate configured to receive a second input signal LNA2_in, a source coupled to a degeneration inductor 523 and a drain coupled to a source of a cascode transistor 526. The other side of the degeneration inductor 523 is coupled to a terminal 527. The terminal 527 may be a circuit connection referred to as a ball, solder ball, micro ball, or other circuit interface for the die 505. An inductance 529 refers to an inductance of a routing connection that couples the terminal 527 to ground. The second LNA 506 also comprises a gain transistor 524 having a gate configured to receive the second input signal, LNA2_in, a source coupled to a degeneration inductor 525 and a drain coupled to a source of a cascode transistor 528. The other side of the degeneration inductor 525 is coupled to the terminal 527. The cascode transistor 526 is configured to receive a LNA2_CA_1_EN enable signal at its gate. The cascode transistor 528 is configured to receive a LNA2 CA_2_EN enable signal at its gate. In an alternative exemplary embodiment, a single source degeneration inductor may be implemented for both gain transistors 522 and 524.

The drain of the cascode transistor 516 and the drain of the cascode transistor 526 are each coupled to a first side of a transformer 540. The drain of the cascode transistor 526 and the drain of the cascode transistor 528 are each coupled to a first side of a transformer 544. The primary side of the transformer 540 is coupled to a system voltage, VDD, through an inductance 542. The primary side of the transformer 544 is coupled to the system voltage, VDD, through an inductance 546.

The matching network 531 is coupled to an input port 532 and a resistance 533 that establishes an input impedance, such as, for example, 50 ohms. The output of the matching network 531 is provided to inductances 534 and 535, and appears at terminals 536 and 537 as the first and second input signals, LNA1_in and LNA2_in, respectively.

The cascode transistor 516 is controlled by the enable signal, LNA1_CA1_EN, at its gate, the cascode transistor 518 is controlled by the enable signal, LNA1_CA2_EN, at its gate, the cascode transistor 526 is controlled by the enable signal, LNA2_CA1_EN, at its gate, and the cascode transistor 528 is controlled by the enable signal, LNA2_CA2_EN, at its gate.

A first side of a capacitance 555 is coupled to a node between the primary side of the transformer 540 and the inductance 542 through a switch 552. The other side of the capacitance 555 is coupled to ground through the connection 526. The switch 552 can be controlled to connect the capacitance 555 to ground, thereby effectively eliminating spurious signal coupling through the transformer 540.

A first side of a capacitance 565 is coupled to a node between the primary side of the transformer 544 and the inductance 546 through a switch 562. The other side of the capacitance 565 is coupled to ground through the connection 527. The switch 562 can be controlled to connect the capacitance 565 to ground, thereby effectively eliminating spurious signal coupling through the transformer 544.

In an exemplary embodiment, controlling the switches 552 and 562 using the SW_EN signals in cooperation with enabling selective cascode transistors using the LNA1_CA1_EN, LNA1_CA2_EN, LNA2_CA1_EN, and LNA2_CA2_EN signals based on a carrier aggregation mode helps to mitigate spurious signal propagation through the transformers 540 and 544 by decoupling an amplification path from its respective transformer if the amplification path is not carrying an active signal. Although two LNAs 504 and 506 are illustrated in FIG. 5, any integer number of LNAs can be implemented. The cascode control signals are unique for each LNA. In this exemplary embodiment, cascode control signals are LNA1_CA1_EN and LNA1_CA2_EN, . . . LNAn_CA1_EN and LNAn_CA2_EN, where in this example, n=2. For example, if LNA1_CA1_EN is ON, then LNAx_CA1_EN are all OFF (x=2, n), and if LNA2_CA2_EN is ON, then LNAx_CA2_EN are all OFF (x=1, . . . , n). In this example, the amplification path comprising gain transistor 512 and cascode transistor 516 is coupled to the transformer 540, and the amplification path comprising gain transistor 524 and cascode transistor 528 is coupled to the transformer 544. Accordingly, the cascode transistor 518 and the cascode transistor 526 are illustrated in phantom line to indicate that they are OFF.

The spurious signals caused by concurrent CA operation can be caused by any or all of LDO power supply/ground routing coupling, coupling between the routings for the LNA CA1 output and the CA2 output, coupling through the cascode transistors, and as a result of magnetic coupling between the transformer 540 and transformer 544. Activating the switch 552 to couple the capacitor 555 to ground removes the transformer 540 from any output or supply path and prevents magnetic coupling from occurring through the transformer 540. Similarly, activating the switch 562 to couple the capacitor 565 to ground removes the transformer 544 from any output or supply path and prevents magnetic coupling from occurring through the transformer 544.

Figure 6:
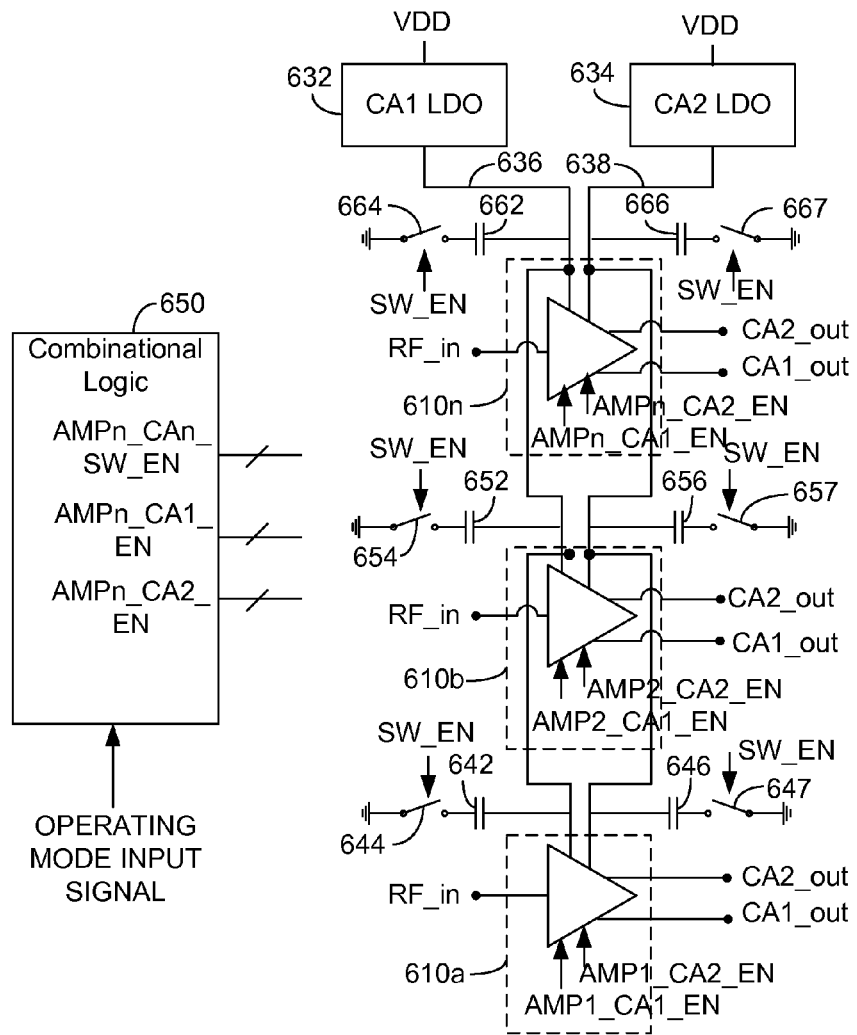
FIG. 6 is a schematic diagram illustrating an exemplary embodiment of an amplifier circuit having a spurious signal mitigation architecture.

FIG. 6 is a schematic diagram 600 illustrating an exemplary embodiment of an amplifier circuit having a spurious signal mitigation architecture. A plurality of amplifier circuits 610a through 610n are all coupled to a shared power distribution network comprising CA1 LDO 632 and CA2 LDO 634. In this example, any number of amplifier circuits 610 may be implemented. The amplifier circuits 610a through 610n may comprise power amplifiers, low noise amplifiers, driver amplifiers, or any other amplifier. In an exemplary embodiment, the amplifiers 610a through 610n may each comprise an instance of the LNA 502 shown in FIG. 5, or alternative embodiments thereof.

Each amplifier 610 is configured to receive a radio frequency input (RF_in) signal and is configured to provide outputs CA1_out and CA2_out. Each of the amplifiers 610 is coupled to both CA1 LDO 632 and CA2 LDO 634 over a shared power distribution network comprising power network 636 for CA1 LDO 632 and power network 6387 for CA2 LDO 634.

A bypass capacitor is associated with each power amplifier circuit 610 where it couples to each power network 636 and 638. Each bypass capacitor is controlled by a switch. A bypass capacitor 642 is coupled at the node coupling the amplifier circuit 610a to the power network 636, and a bypass capacitor 646 is coupled at the node coupling the amplifier circuit 610a to the power network 638. Similarly, a bypass capacitor 652 is coupled at the node coupling the amplifier circuit 610b to the power network 636, and a bypass capacitor 656 is coupled at the node coupling the amplifier circuit 610b to the power network 638; and a bypass capacitor 662 is coupled at the node coupling the amplifier circuit 610n to the power network 636, and a bypass capacitor 666 is coupled at the node coupling the amplifier circuit 610n to the power network 638.

A combinational logic circuit 650 produces the control signals, SW_EN, that control the switches 644, 654, 664, 647, 657 and 667, and produces the control signals CA1_EN and CA2_EN that control the amplifier circuits 610a, 610n and 610n. In an exemplary embodiment, there will be an amplifier specific control signal AMPn_CA1_EN and AMPn_CA2_EN provided to each amplifier 610a through 610n, where "n" refers to the amplifier 610, and a switch specific control signal AMPn_CA1_SW_EN and AMPn_CA2_SW_EN provided to each switch 644, 654, 664, 647, 657 and 667. In this manner, in an exemplary embodiment, the operation of the bypass capacitors 642, 652, 662, 646, 656 and 666 is synchronized with the operation of the amplifier circuits 610a, 610b and 610n based on the selected carrier aggregation mode and the active signal path.

In this exemplary embodiment, both the amplifier enable signals (AMPn_CA1_EN, AMPn_CA2_EN) and the corresponding bypass capacitor control signal (AMPn_CAn_SW_EN) are linked together in the combinational logic 650. Each amplifier 610 receives AMPn_CA1_EN and AMPn_CA2_EN control signals and control signals AMPn_CA1_SW_EN and AMPn_CA2_SW_EN are provided for controlling the respective bypass switches in cooperation with the amplifier control signals. For example, amplifier 610a can be a first low noise amplifier configured to receive the control signals AMP1_CA1_EN and AMP1_CA2_EN. In this example for amplifier 610a, its bypass capacitor switches 644 and 647 are controlled by individual enable signals. For this example, amplifier 610a has two switched bypass capacitors 642 and 646 connected to CA1 LDO power supply 632 and to CA2 LDO power supply 634, respectively. In this example, the amplifier control signal AMP1_CA1_EN is linked to the control signal AMP1_CA1_SW_EN to control the bypass capacitor switch 644 connected to the CA1 LDO power supply 632. Similarly, the control signal AMP1_CA2_EN is also related to the control signal AMP1_CA2_SW_EN, which controls the bypass capacitor switch 647 connected to CA2 LDO power supply 634. Each of the switches 654, 657, 664 and 667 associated with the amplifiers 610n through 610n have similar individual control signals provided by the combinational logic 650. In an exemplary embodiment, the control signals are determined by the carrier aggregation (CA) mode signal, which can be provided to the combinational logic from, for example, the data processor 310 (FIG. 3), or another control circuit.

Figure 7:
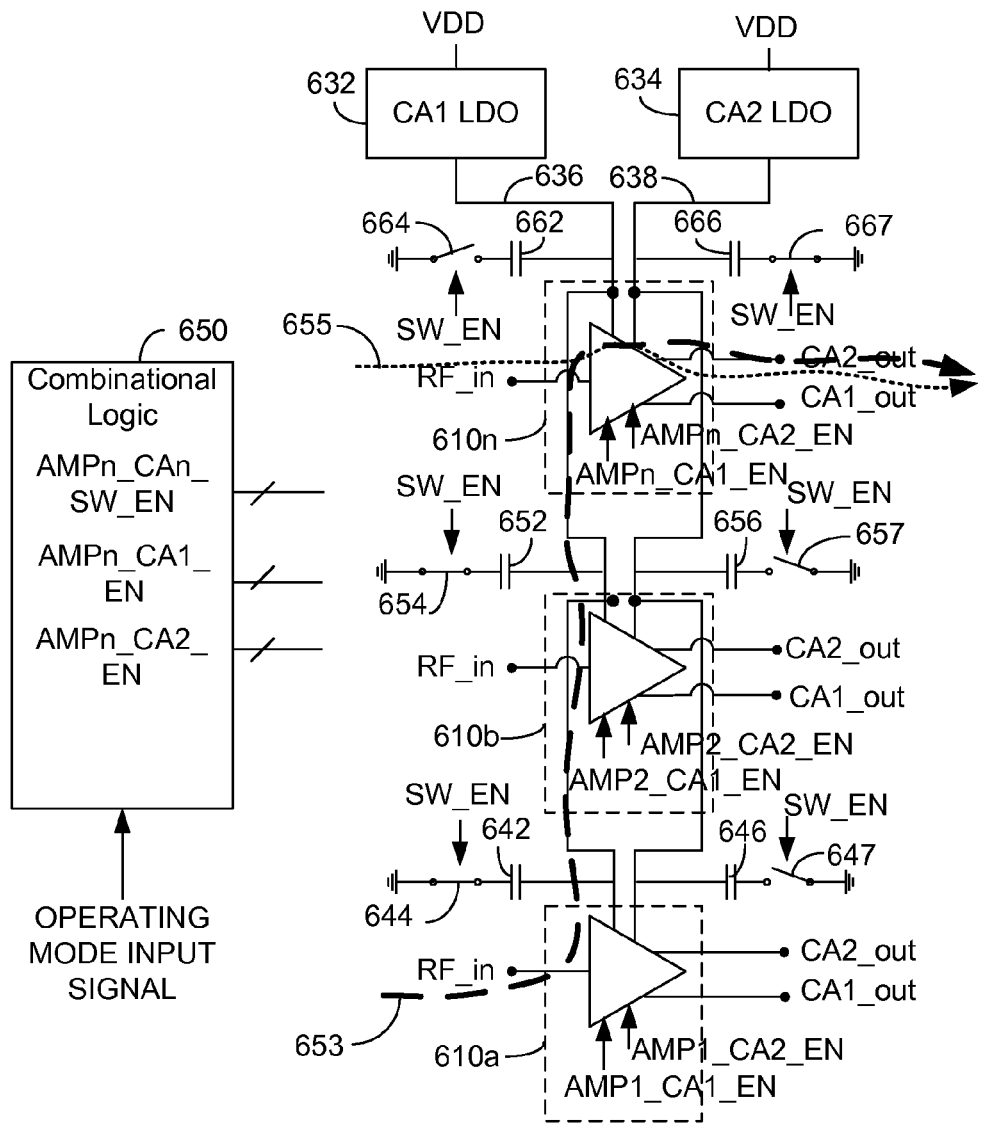
FIG. 7 is an exemplary operating mode of the architecture of FIG. 6.

FIG. 7 is an exemplary operating mode of the architecture of FIG. 6. In an exemplary embodiment, the combinational logic 650 receives an operating mode input signal. The operating mode input signal comprises information relating to the carrier aggregation mode, including which amplifier processes which carrier. In the exemplary embodiment shown in FIG. 7, in response to the operating mode, the combinational logic 650 causes the switches 644 and 667 to be closed, thereby coupling bypass capacitors 642 and 666 to ground. Simultaneously with closing the switches 644 and 667 the amplifier 610n is enabled to provide the output CA2_out and the amplifier 610a is enabled to provide the output CA1_out. The dotted line 653 shows a spurious signal coupling path that could interfere with the operation of the amplifier 610n, which in this example, is processing a desired signal 655. In this example, the desired signal 655 is amplified by the amplifier 610n and is provided as an output signal CA2_out. In this mode, closing the switch 654 to couple the bypass capacitor 652 to ground (even though the amplifier 610b is not enabled) can reduce the coupling from the signal 653 to the signal 655 in the active signal path associated with the power network 638, thereby preventing spurious signals from degrading the desired signal output CA2_out of the amplifier 610n on which the desired signal 655 is provided. For the example shown in FIG. 7, the switch 654 is typically turned off by default because in general only two amplifiers can be turned on at a time and because the amplifier 610b is not part of an active amplification path. In this exemplary embodiment, the amplifier 610a is enabled to provide the CA1 output, and the amplifier 610n is enabled to provide the CA2 output. The bypass capacitor 642 associated with the CA1 LDO power supply 632 and power network 636 is grounded and the bypass capacitor 666 associated with the CA2 LDO power supply 634 and power network 638 is grounded. All other amplifiers and switched bypass capacitors are turned off by default. However, to mitigate the spurious signal coupling shown by the dotted line 653 the switch 654 can be overridden to be turned on even though the amplifier 610b is not enabled.

Figure 8A:
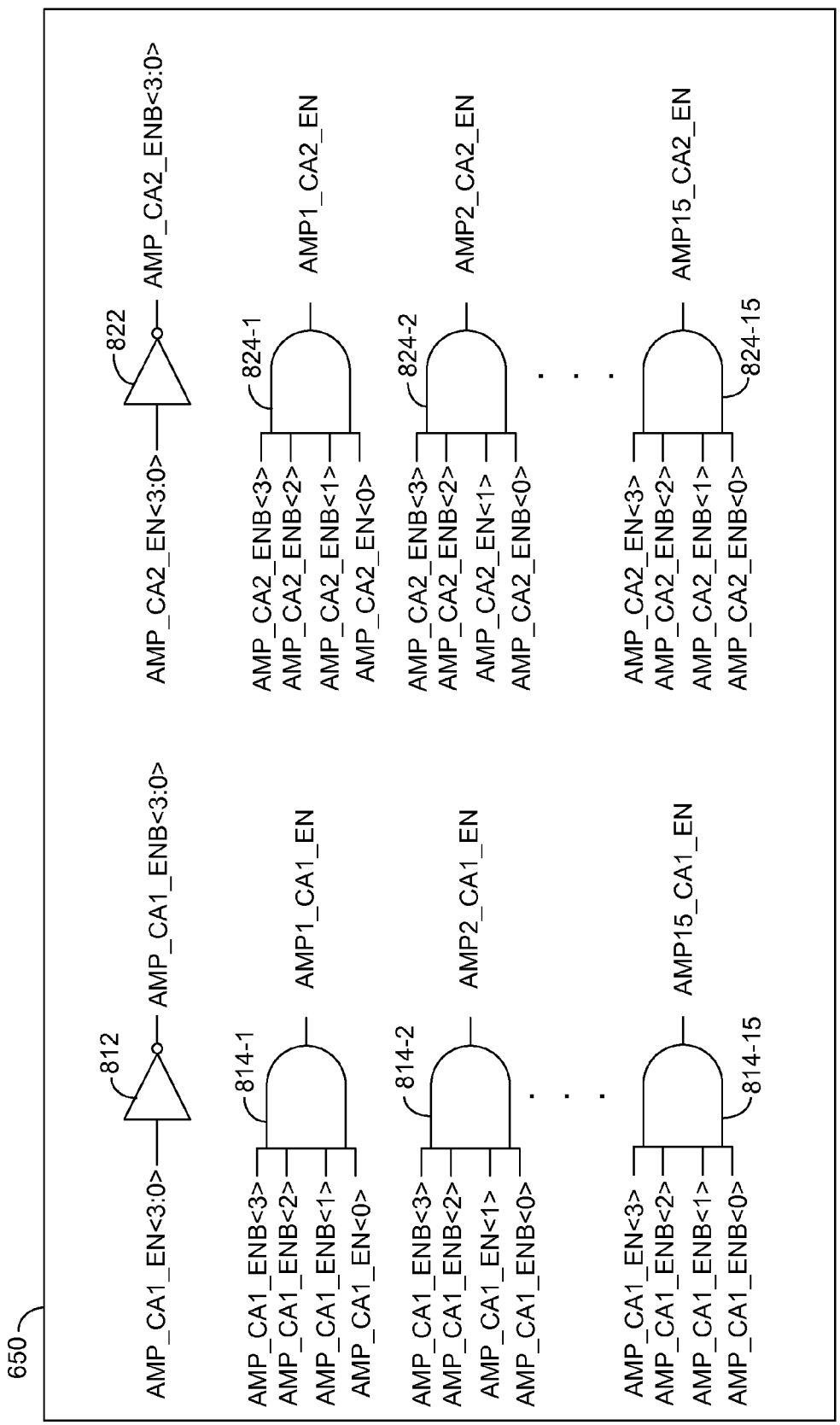
FIG. 8A is a block diagram showing an exemplary embodiment of the combinational logic of FIG. 6.
Figure 8B:
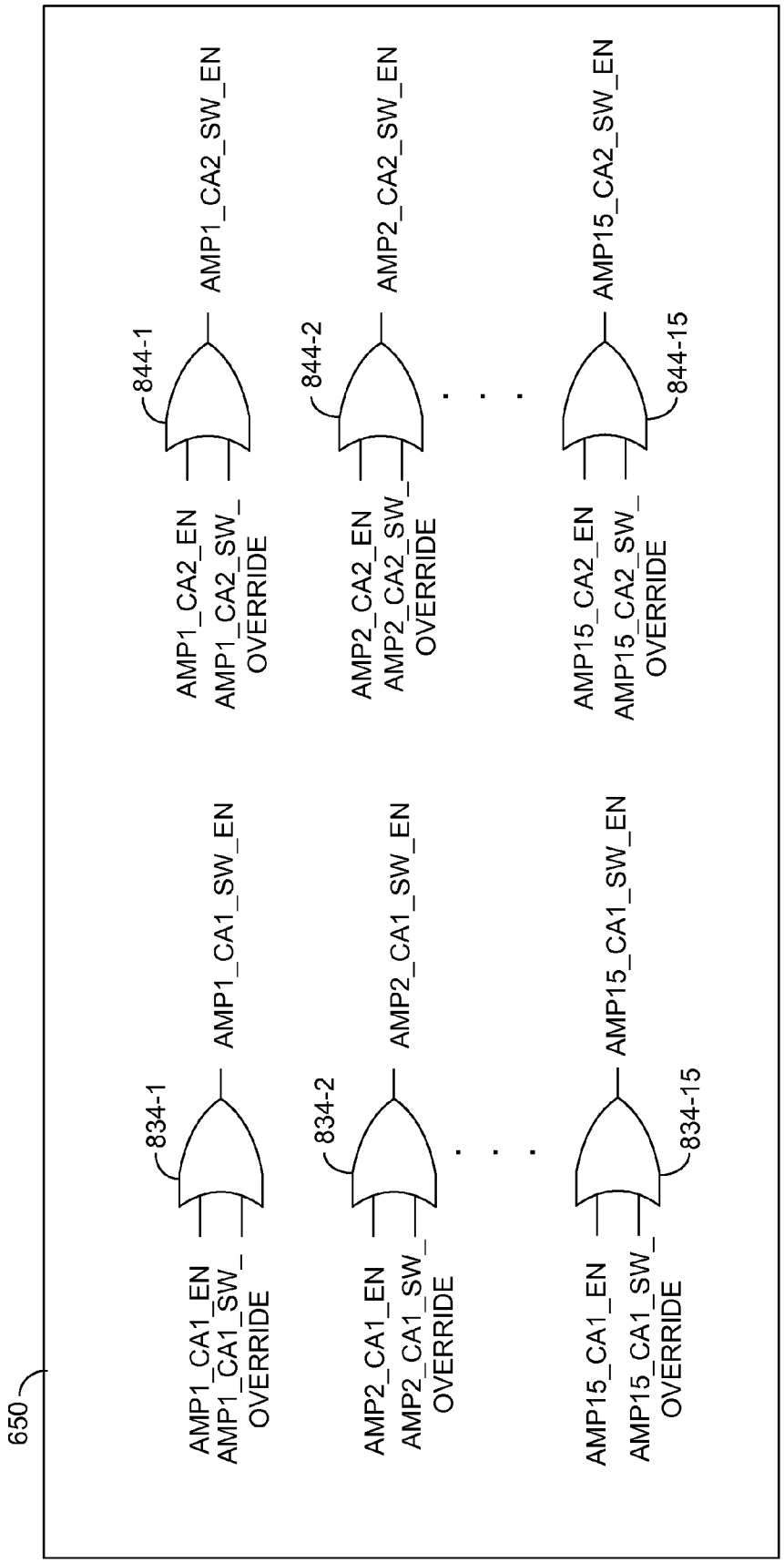
FIG. 8B is a block diagram showing an exemplary embodiment of the combinational logic of FIG. 6.

FIG. 8A and FIG. 8B are block diagrams showing an exemplary embodiments of the combinational logic 650 of FIG. 6. In this exemplary embodiment, the combinational logic 650 is configured to control 15 amplifiers and associated bypass capacitors, and will be described in the context of the amplifiers being low noise amplifiers. (LNAs). In other exemplary embodiments, more or fewer amplifiers and associated bypass capacitors may be implemented.

The combinational logic 650 comprises buffers 812 and 822. The buffer 812 is configured to receive a four bit input signal AMP_CA1_EN<3:0>, and the buffer 822 is configured to receive a four bit input signal AMP_CA2_EN<3:0>. Both the input signal AMP_CA1_EN<3:0> and the input signal AMP_CA2_EN<3:0> can comprise a four bit bus. The terms "EN" and "ENB" are complementary such that when a signal having the term "EN" is logic high, the complementary signal having the term "ENB" is logic low.

The combinational logic 650 comprises also comprises logic gates 814-1 through 814-15, logic gates 824-1 through 824-15, logic gates 834-1 through 834-15 and logic gates 844-1 through 844-15. In this exemplary embodiment in which 15 amplifiers and related bypass capacitors are controlled, there is one instance of logic gate 814 and one instance of logic gate 824 for each amplifier, and one instance of logic gate 834 and one instance of logic gate 844 for each switch and bypass capacitor. In this exemplary embodiment, each logic gate 814 and each logic gate 824 is configured as a four (4) input AND gate and each logic gate 834 and each logic gate 844 is configured as a two (2) input OR gate.

In an exemplary embodiment, the logic gate 814-1 receives as inputs the signals AMP_CA1_EN<0>, AMP_CA1_ENB<1>, AMP_CA1_ENB<2> and AMP_CA1_ENB<3>, and generates a control signal AMP1_CA1_EN. Similarly, the logic gate 814-2 receives as inputs the signals AMP_CA1_ENB<0>, AMP_CA1 EN<1>, AMP_CA1_ENB<2> and AMP_CA1_ENB<3>, and generates a control signal AMP2_CA1_EN; and the logic gate 814-15 receives as inputs the signals AMP_CA1_ENB<0>, AMP_CA1_ENB<1>, AMP_CA1_BEN<2> and AMP_CA1_EN<3>, and generates a control signal AMP15_CA1_EN.

In an exemplary embodiment, the logic gate 824-1 receives as inputs the signals AMP_CA2_EN<0>, AMP_CA2_ENB<1>, AMP_CA2_ENB<2> and AMP_CA2_ENB<3>, and generates a control signal AMP1_CA2_EN. Similarly, the logic gate 824-2 receives as inputs the signals AMP_CA2_ENB<0>, AMP_CA2_EN<1>, AMP_CA2_ENB<2> and AMP_CA2_ENB<3>, and generates a control signal AMP2_CA2_EN; and the logic gate 824-15 receives as inputs the signals AMP_CA2_ENB<0>, AMP_CA2_ENB<1>, AMP_CA2_ENB<2> and AMP_CA2_EN<3>, and generates a control signal AMP15_CA2_EN.

In an exemplary embodiment, the logic gate 834-1 receives as inputs the signals AMP1_CA1_EN and AMP1_CA1_SW_OVERRIDE, and generates a control signal AMP1_CA1_SW_EN. Similarly, the logic gate 834-2 receives as inputs the signals AMP2_CA1_EN and AMP2_CA1_SW_OVERRIDE, and generates a control signal AMP2_CA1_SW_EN; and the logic gate 834-15 receives as inputs the signals AMP15_CA1 EN and AMP15_CA1_SW_OVERRIDE, and generates a control signal AMP15_CA1_SW_EN. If either of the inputs AMPn_CA1_EN or AMPn_CA1_SW_OVERRIDE provided to the logic gates 834 are logic high, then the output will be logic high.

In an exemplary embodiment, the logic gate 844-1 receives as inputs the signals AMP1_CA2_EN and AMP1_CA2_SW_OVERRIDE, and generates a control signal AMP1_CA2_SW_EN. Similarly, the logic gate 844-2 receives as inputs the signals AMP2_CA2_EN and AMP2_CA2_SW_OVERRIDE, and generates a control signal AMP2_CA2_SW_EN; and the logic gate 844-15 receives as inputs the signals AMP15_CA2_EN and AMP15_CA2_SW_OVERRIDE, and generates a control signal AMP15_CA2_SW_EN. If either of the inputs AMPn_CA2_EN or AMPn_CA2_SW_OVERRIDE provided to the logic gates 844 are logic high, then the output will be logic high.

In an exemplary embodiment, the AMPn_CAn_SW_OVERRIDE control signal inputs are set by default to logic zero, so that the amplifier control signals AMPn_CAn_EN function as the switch control signals. However, if it is desired to couple a bypass capacitance associated with an amplifier that is not enabled, the appropriate AMPn_CAn_SW_OVERRIDE control signal can cause the associated bypass capacitance to be coupled to ground, regardless of whether the associated amplification path is active.

In an exemplary embodiment, if the input signal AMP_CA1_EN<3:0>=0001 and AMP_CA2_EN<3:0>=0100, then AMP1_CA1_EN and AMP4_CA2_EN are ON, the outputs will enable the AMP1 (CA1 Output) and AMP4 (CA2 Output), and the corresponding bypass capacitors (AMP1 bypass capacitance on LDO CA1 supply and the AMP4 bypass capacitance on LDO CA2 supply are turned ON.

In an exemplary embodiment, the override inputs AMP1_CA1_SW_OVERRIDE through AMP15_CA1_SW_OVERRIDE; and AMP1_CA2_SW_OVERRIDE through AMP15_CA2_SW_OVERRIDE, allow any of the bypass capacitors to be grounded independently of whether the associated amplifier is enabled.

Figure 9:
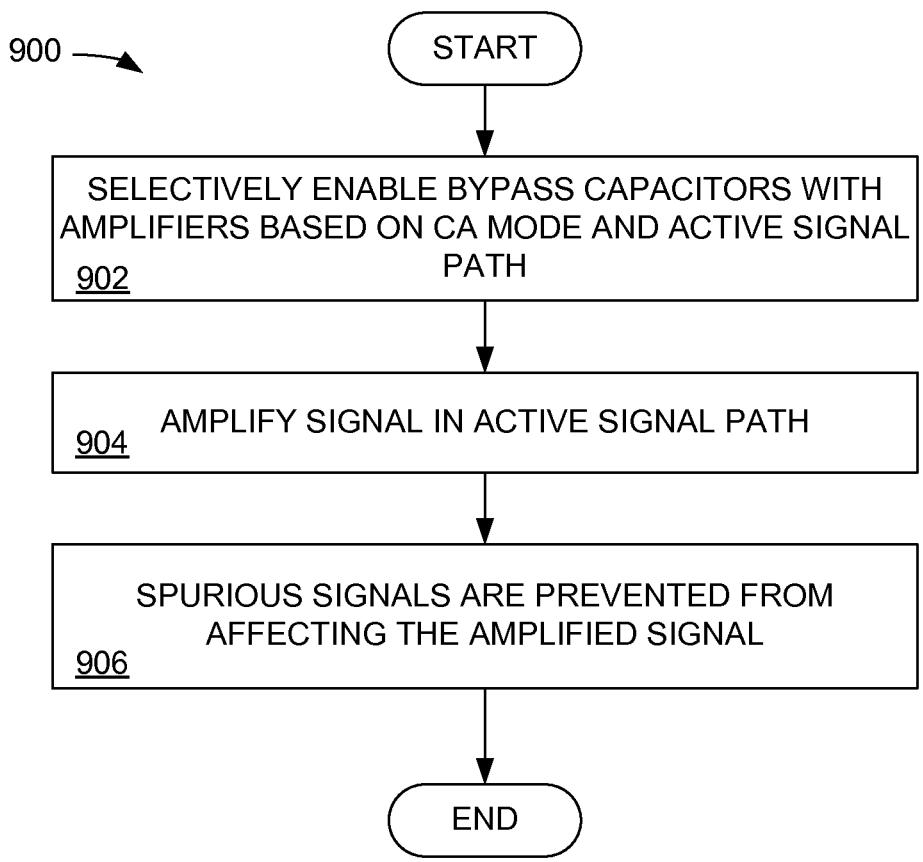
FIG. 9 is a flow chart showing an exemplary embodiment of a method for spurious signal mitigation.

FIG. 9 is a flow chart showing an exemplary embodiment of a method for spurious signal mitigation.

In block 902, bypass capacitors and amplifiers are selectively enabled based on a selected operation mode and a selected active signal path.

In block 904, the signal is amplified in the active signal path.

In block 908, spurious signals are prevented from affecting the amplified signal in the active signal path.

The spurious signal mitigation architecture described herein may be implemented on one or more ICs, analog ICs, RFICs, mixed-signal ICs, ASICs, printed circuit boards (PCBs), electronic devices, etc. The spurious signal mitigation architecture may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the spurious signal mitigation architecture described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A device, comprising:
an amplifier circuit comprising a first amplification path and a second amplification path;
a switchable bypass capacitance coupled to an associated shared power distribution network, the switchable bypass capacitance and the first and second amplification paths responsive to a control signal configured to selectively ground the switchable bypass capacitance and selectively enable one of the first and second amplification paths while selectively disabling the other of the first and second amplification paths based on a selected operating mode, wherein the switchable bypass capacitance corresponds to the disabled one of the first and second amplification paths.

2. The device of claim 1, wherein the amplifier circuit comprises a low noise amplifier.

3. The device of claim 1, wherein the control signal comprises an override signal configured to selectively ground the switchable bypass capacitance corresponding to the disabled one of the first and second amplification paths.

4. The device of claim 3, wherein selectively grounding the switchable bypass capacitance corresponding to the disabled amplification path mitigates spurious signals through the disabled one of the first and second amplification paths.

5. The device of claim 1, further comprising combinational logic configured to generate the control signal to control a selected one of a plurality of amplifiers associated with each of the first and second amplification paths and the switchable bypass capacitance associated with the selected one of the plurality of amplifiers.

6. The device of claim 1, wherein each of the first and second amplification paths comprises an amplifier, and the control signal comprises an override signal configured to ground the switchable bypass capacitance associated with the amplifier of the disabled one of the first and second amplification paths.

7. The device of claim 6, wherein the at least one switchable bypass capacitance associated with the amplifier of the disabled one of the first and second amplification paths being grounded mitigates spurious signals through the amplifier of the disabled one of the first and second amplification paths.

8. The device of claim 1, wherein each of the first and second amplification paths comprises an amplifier and at least one switchable bypass capacitance, and wherein the control signal is configured to ground the at least one switchable bypass capacitance associated with the amplifier of the disabled one of the first and second amplification paths or the amplifier of an enabled one of the first and second amplification paths.

9. A method comprising:
selectively grounding a switchable bypass capacitance associated with a shared power distribution network based on a selected operating mode; and
selectively enabling one of first and a second amplification paths of an amplifier circuit while disabling the other of the first and second amplification paths, the amplifier circuit associated with the shared power distribution network, the enabled one of the first and second amplification paths generating an output signal based on the selected operating mode, the selectively grounded switchable bypass capacitance corresponding to the disabled one of the first and second amplification paths.

10. The method of claim 9, wherein selectively grounding the switchable bypass capacitance based on the selected operating mode prevents a spurious signal from interfering with a desired signal in the enabled one of the first and second amplification paths.

11. The method of claim 9, further comprising selectively grounding the switchable bypass capacitance corresponding to the disabled one of the first and second amplification paths in response to an override signal.

12. The method of claim 11, wherein selectively grounding the switchable bypass capacitance corresponding to the disabled one of the first and second amplification paths in response to an override signal mitigates spurious signals through the disabled one of the first and second amplification paths.

13. The method of claim 9, further comprising controlling a selected one of a plurality of amplifiers associated with each amplification path and the switchable bypass capacitance associated with the selected one of the plurality of amplifiers using a single control signal.

14. The method of claim 9, further comprising selectively grounding at least one switchable bypass capacitance associated with the enabled one of the first and second amplification paths.

15. A device, comprising:
means for selectively grounding a switchable bypass capacitance associated with a shared power distribution network based on a selected operating mode; and
means for selectively enabling one of first and second amplification paths of an amplifier circuit while disabling the other of the first and second amplification paths, the amplifier circuit associated with the shared power distribution network, the enabled one of the first and second amplification paths generating an output signal based on the selected operating mode, the selectively grounded switchable bypass capacitance corresponding to the disabled one of the first and second amplification paths.

16. The device of claim 15, further comprising means for preventing a spurious signal from interfering with a desired signal in the enabled one of the first and second amplification paths.

17. The device of claim 15, wherein one of the first and second amplification paths is disabled when the bypass capacitance corresponding to the disabled one of the first and second amplification paths is grounded.

18. The device of claim 17, further comprising means for mitigating spurious signals through the disabled one of the first and second amplification paths.

19. The device of claim 15, further comprising means for controlling a selected one of a plurality of amplifiers associated with each of the first and second amplification paths and the switchable bypass capacitance associated with the selected one of the plurality of amplifiers using a single control signal.

20. The device of claim 15, further comprising means for selectively grounding a second switchable bypass capacitance associated with the enabled one of the first and second amplification paths.

* * * * *